United States Patent
Schoneck et al.

(10) Patent No.: US 11,929,390 B2
(45) Date of Patent: Mar. 12, 2024

(54) TEMPERATURE-DEPENDENT CAPACITOR

(71) Applicant: International Business Machines Corporation, Armonk, NY (US)

(72) Inventors: Kyle Schoneck, Rochester, MN (US); Matthew A. Walther, Rochester, MN (US); Jason J. Bjorgaard, Rochester, MN (US); John R. Dangler, Rochester, MN (US); Layne A. Berge, Rochester, MN (US); Thomas W. Liang, Rochester, MN (US); Matthew Doyle, Chatfield, MN (US)

(73) Assignee: International Business Machines Corporation, Armonk, NY (US)

(*) Notice: Subject to any disclaimer, the term of this patent is extended or adjusted under 35 U.S.C. 154(b) by 171 days.

(21) Appl. No.: 17/174,830

(22) Filed: Feb. 12, 2021

(65) Prior Publication Data
US 2022/0262893 A1 Aug. 18, 2022

(51) Int. Cl.
*H01G 4/10* (2006.01)
*H01G 2/06* (2006.01)
(Continued)

(52) U.S. Cl.
CPC .............. *H01L 28/56* (2013.01); *H01G 2/06* (2013.01); *H01G 4/06* (2013.01); *H01G 4/10* (2013.01);
(Continued)

(58) Field of Classification Search
CPC . H01L 28/56; H01G 4/10; H01G 2/06; H01G 4/06; H01G 4/12; H01G 4/40; H01G 9/21
See application file for complete search history.

(56) References Cited

U.S. PATENT DOCUMENTS 3,315,180 A * 4/1967 Racy ................ H01P 7/04
330/56
4,441,876 A * 4/1984 Marc ................ H05B 6/54
264/491
(Continued)

FOREIGN PATENT DOCUMENTS

EP 2831895 B1 6/2018

OTHER PUBLICATIONS

US Patent Office (SIR), Buchanan et al., "Temperature stable ceramic dielectric compositions (USH0000987)," An IP.com Prior Art Database Technical Disclosure, IP.com No. IPCOM000000982D, Original Publication: Nov. 5, 1991, Electronic Publication: Jun. 14, 2008, 7 pages, https://ip.com/IPCOM/000000982.
(Continued)

*Primary Examiner* — Ahmed N Sefer
(74) *Attorney, Agent, or Firm* — Kelsey M. Skodje; Robert J. Shatto

(57) ABSTRACT

A temperature-dependent capacitor comprises a first conductive plate, a second conductive plate located in a parallel-planar orientation to the first conductive plate, and a dielectric material located between the first conductive plate and the second conductive plate, the dielectric material having a temperature-dependent dielectric constant ($\epsilon$) value, wherein the temperature-dependent capacitor has a positive correlation of an operating temperature of the temperature-dependent capacitor to a capacitance value of the temperature-dependent capacitor.

20 Claims, 9 Drawing Sheets

(51) Int. Cl.
*H01G 4/06* (2006.01)
*H01G 4/12* (2006.01)
*H01G 4/40* (2006.01)
*H01G 9/21* (2006.01)
*H01L 49/02* (2006.01)

(52) U.S. Cl.
CPC ................. *H01G 4/12* (2013.01); *H01G 4/40* (2013.01); *H01G 9/21* (2013.01)

(56) References Cited

U.S. PATENT DOCUMENTS

| | | | | |
|---|---|---|---|---|
| 4,628,612 | A * | 12/1986 | Hori | G01C 9/34 |
| | | | | 33/366.19 |
| 4,920,450 | A * | 4/1990 | Masiulis | H01G 7/00 |
| | | | | 333/261 |
| 5,021,795 | A * | 6/1991 | Masiulis | H01Q 9/0442 |
| | | | | 343/745 |
| 6,881,682 | B2 | 4/2005 | Zheng et al. | |
| 7,986,507 | B2 * | 7/2011 | Shimanouchi | H01G 5/16 |
| | | | | 361/278 |
| 8,815,677 | B2 | 8/2014 | Chen et al. | |
| 9,496,596 | B2 | 11/2016 | Chirila | |
| 2003/0000645 | A1 | 1/2003 | Dornfest | |
| 2004/0159158 | A1 * | 8/2004 | Forster | B60C 23/0433 |
| | | | | 73/718 |
| 2004/0169967 | A1 * | 9/2004 | Konaka | C04B 35/6303 |
| | | | | 361/15 |
| 2006/0244606 | A1 * | 11/2006 | Li | H01Q 9/28 |
| | | | | 340/572.7 |
| 2007/0087929 | A1 * | 4/2007 | Park | H05K 1/162 |
| | | | | 501/100 |
| 2007/0109720 | A1 * | 5/2007 | Kamei | H01G 4/33 |
| | | | | 361/321.2 |
| 2013/0292952 | A1 * | 11/2013 | Skotnicki | H02N 1/08 |
| | | | | 290/1 R |
| 2014/0203403 | A1 * | 7/2014 | Shimanouchi | H01L 21/687 |
| | | | | 257/532 |
| 2015/0364257 | A1 * | 12/2015 | Ma | H01G 4/32 |
| | | | | 427/80 |
| 2019/0006459 | A1 | 1/2019 | Yeldandi et al. | |
| 2019/0304635 | A1 * | 10/2019 | Konno | H01L 41/09 |
| 2020/0235278 | A1 * | 7/2020 | Van Den Ende | H01L 41/183 |
| 2022/0102481 | A1 * | 3/2022 | Du | H01L 28/60 |

OTHER PUBLICATIONS

Puli et al., "Structure, dielectric, ferroelectric, and energy density properties of (1-x)BZT-xBCT ceramic capacitors for energy storage applications," J Mater Sci (2013) 48:2151-2157, Springer, DOI: 10.1007/s10853-012-6990-1.

"FoamClad R/F™ 100," Data Sheet, Arlon Materials for Electronics, May 20, 2003, 4 pages. http://www.ctsind.com/pdf/FoamCladRF100%20Data%20Sheet.pdf.

* cited by examiner

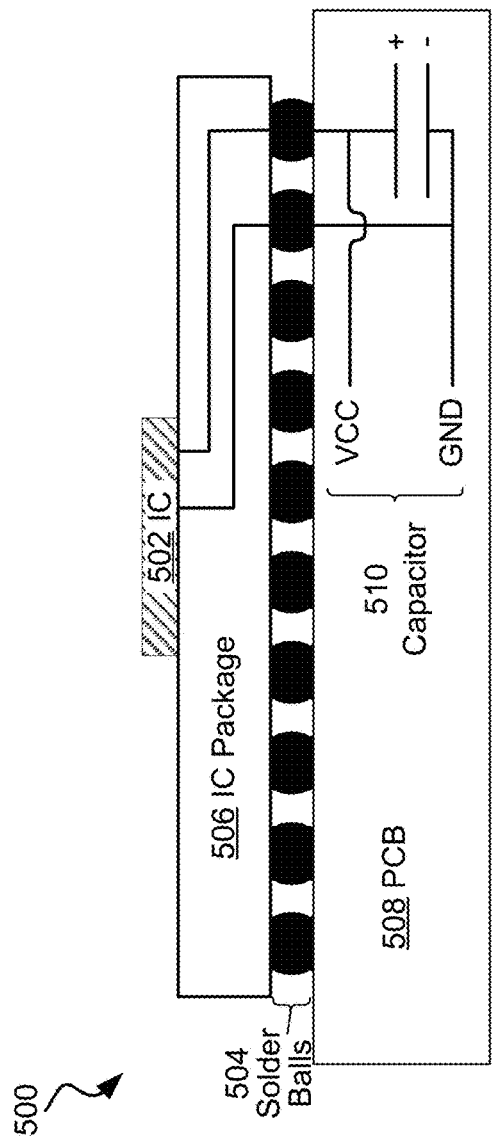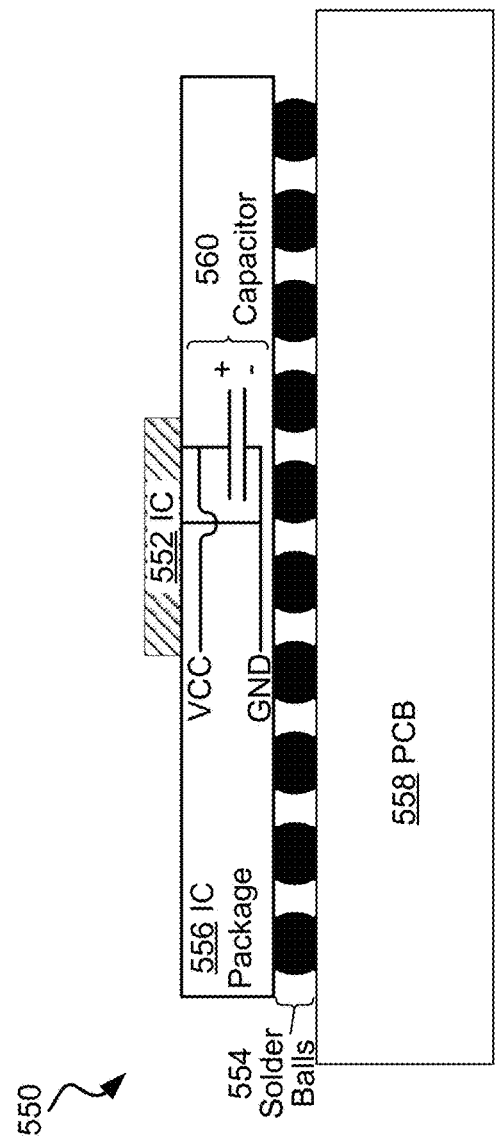

TEMPERATURE-DEPENDENT CAPACITOR

BACKGROUND

The present disclosure generally relates to capacitors, and more specifically, to capacitors used with printed circuit boards (PCBs) and/or first level packages. In particular, this disclosure relates to a temperature-dependent decoupling capacitor having a positive correlation between operating temperature and capacitance value.

A capacitor is a passive electrical component having at least two electrical conductors known as plates, separated by a dielectric or insulator, and which can be used to electrostatically store energy in an electric field. Capacitors can be useful as circuit elements in conjunction with a variety of types of electronic devices such as digital and analog integrated circuits.

A printed circuit board, or PCB, can be used to mechanically support and electrically connect electronic components using conductive paths or signal traces etched from copper sheets laminated onto non-conductive substrates. Multiple copper/insulator layer pairs, also known as "cores," can be laminated together in the fabrication of the PCB. The number and arrangement of cores can be designed to fit the needs of a variety of applications. Some PCBs with multiple layers can include decoupling capacitors between the layers.

SUMMARY

Disclosed herein are embodiments of a temperature dependent capacitor, system, and method of manufacture. In some embodiments, a temperature-dependent capacitor comprises a first conductive plate, a second conductive plate located in a parallel-planar orientation to the first conductive plate, and a dielectric material located between the first conductive plate and the second conductive plate, the dielectric material having a temperature-dependent dielectric constant ($\varepsilon$) value, wherein the temperature-dependent capacitor has a positive correlation of an operating temperature of the temperature-dependent capacitor to a capacitance value of the temperature-dependent capacitor.

In some embodiments, an electronic system comprises: a printed circuit board (PCB), a component electrically and mechanically attached to the PCB, and a temperature-dependent decoupling capacitor affixed to the PCB, the temperature-dependent decoupling capacitor electrically coupled to the component. The temperature-dependent decoupling capacitor comprises a first conductive plate, a second conductive plate located in a parallel-planar orientation to the first conductive plate, and a dielectric material located between the first conductive plate and the second conductive plate, the dielectric material having a temperature-dependent dielectric constant ($\varepsilon$) value, wherein the temperature-dependent decoupling capacitor has a positive correlation of an operating temperature of the temperature-dependent decoupling capacitor to a capacitance value of the temperature-dependent decoupling capacitor.

In some embodiments, a method for manufacturing a temperature-dependent capacitor comprises: forming a first plate structure, forming a first dielectric material attached to the first plate structure, attaching a bimetallic strip to the dielectric material, forming a second dielectric material attached to the bimetallic strip, and forming a first plate structure attached to the second dielectric material.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 5A depicts a cross-sectional view diagram of an example printed circuit board (PCB), integrated circuit (IC) package, and IC where a temperature-dependent decoupling capacitor is positioned within the PCB, in accordance with embodiments of the present disclosure.

FIG. 5B depicts a cross-sectional view diagram of an example printed circuit board (PCB), integrated circuit (IC) package, and IC where a temperature-dependent decoupling capacitor is positioned within the IC package, in accordance with embodiments of the present disclosure.

Figure 1A:
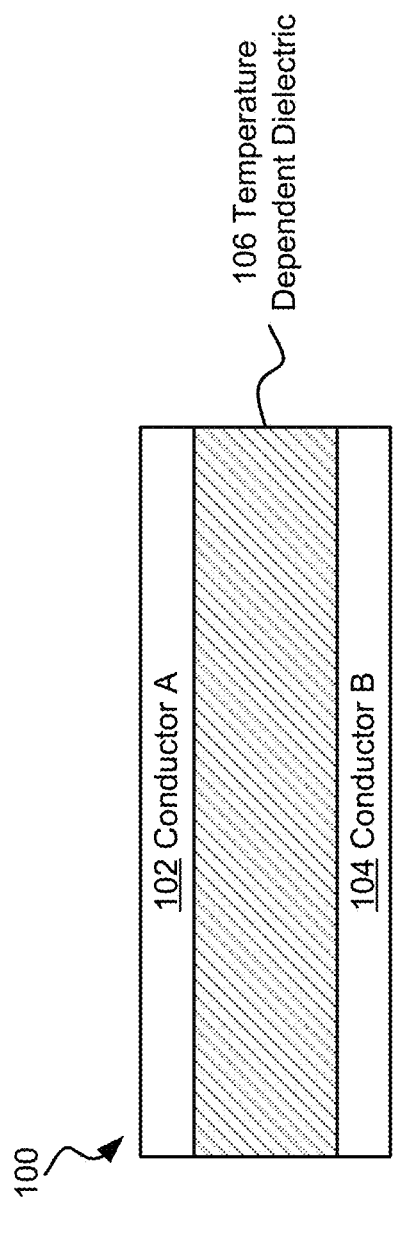
FIG. 1A depicts a diagram of an example capacitor including a temperature-dependent dielectric, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to capacitors, and more particular aspects relate to temperature-dependent decoupling capacitors used with printed circuit boards (PCBs) and/or first level packages. While the present disclosure is not necessarily limited to such applications, various aspects of the disclosure may be appreciated through a discussion of various examples using this context.

A capacitor is a passive electrical component having at least two electrical conductors known as plates, separated by a dielectric or insulator, and which can be used to electrostatically store energy in an electric field. The physical form and construction of capacitors can vary widely; however, a typical capacitor has metallic plates in the form of foil, thin film, a sintered bead of metal, or an electrolyte. The plates are generally located in a parallel-planar orientation or substantially parallel-planar orientation. References herein to parallel should be interpreted to allow for acceptable deviance from exactly parallel. Common dielectric materials include glass, ceramic, plastic film, paper, mica, air, and oxide layers. Dielectric materials have a property alternatively known as a dielectric constant, permittivity, or electric permittivity and abbreviated as Dk or $\varepsilon$.

As disclosed herein, it is possible to use a dielectric material which has a dielectric constant ($\varepsilon$) which is dependent on temperature. The capacitance of a capacitor can be expressed by equation 1: $C=\varepsilon A/d$ where C is the capacitance, $\varepsilon$ is the dielectric constant of the dielectric, A is the area of a plate, and d is the distance between the plates. As such, when the dielectric constant of a capacitor rises, so too does the capacitance. In a similar fashion, if one or both of the plates moves such that the distance between the plates is decreased, capacitance is increased due to the inverse relationship between these variables. In embodiments disclosed herein, one or both of the plates can be comprised of a bimetallic strip which bends in response to temperature change. This can move the plates closer together, thereby changing d and correspondingly changing the capacitance of the capacitor.

A printed circuit board, or PCB, can be comprised of multiple layers. Some PCBs with multiple layers can include decoupling capacitors between the layers which can protect one part of a circuit from the effect of another, for instance to suppress noise or transients. Noise caused by other circuit elements is shunted through the capacitor, reducing the effect they have on the rest of the circuit. The layers in the PCB contributing to the capacitive properties can also function as parallel plates, and have a dielectric in between them, enabling them to operate as a parallel plate capacitor.

A temperature-dependent capacitor present on or within a PCB can therefore affect the noise or transients involved in a PCB and serve as a temperature-dependent decoupling capacitor. If a temperature-dependent capacitor has a positive correlation between temperature and capacitance (e.g., dielectric constant of the dielectric rises with increased temperature or the distance between the plates of the capacitor decreases with increased temperature), an increase in temperature of the PCB and capacitor can provide for greater capacitance and ability to suppress noise, which may also be increasing with temperature. By employing a temperature-dependent decoupling capacitor with a positive correlation between temperature and capacitance, alternative tactics to reduce noise as temperature increases (such as slowing clocks) can be avoided. Additionally, PCB manufacturers or users which expect a warm ambient temperature or otherwise warm operating environment for a PCB can use the teachings presented herein instead of adding additional capacitors, thereby saving space on or within a PCB. These same advantages and considerations can apply to a first level package, and a temperature-dependent decoupling capacitor can be used with a first level package to increase capacitance and reduce noise when the temperature is increased. These improvements and/or advantages are a non-exhaustive list of example advantages. Embodiments of the present disclosure exist which can contain none, some, or all of the aforementioned advantages and/or improvements.

FIG. 1A depicts a diagram of an example capacitor 100 including a temperature-dependent dielectric, in accordance with embodiments of the present disclosure. Capacitor 100 is comprised of conductor A 102, conductor B 104, and temperature-dependent dielectric 106. Conductors A 102 and B 104 serve as the parallel plates of capacitor 100, and temperature-dependent dielectric 106 serves as the dielectric of capacitor 100. Temperature-dependent dielectric 106 can take the form of a non-adhesive based dielectric in some embodiments. If temperature-dependent dielectric 106 has a relationship with a positive correlation between temperature and dielectric constant, when the temperature of capacitor 100 and its components is increased, the capacitance of capacitor 100 is increased. If temperature-dependent dielectric 106 has a relationship with a negative correlation between temperature and dielectric constant, when the temperature of capacitor 100 and its components is increased, the capacitance of capacitor 100 is decreased.

Figure 1B:
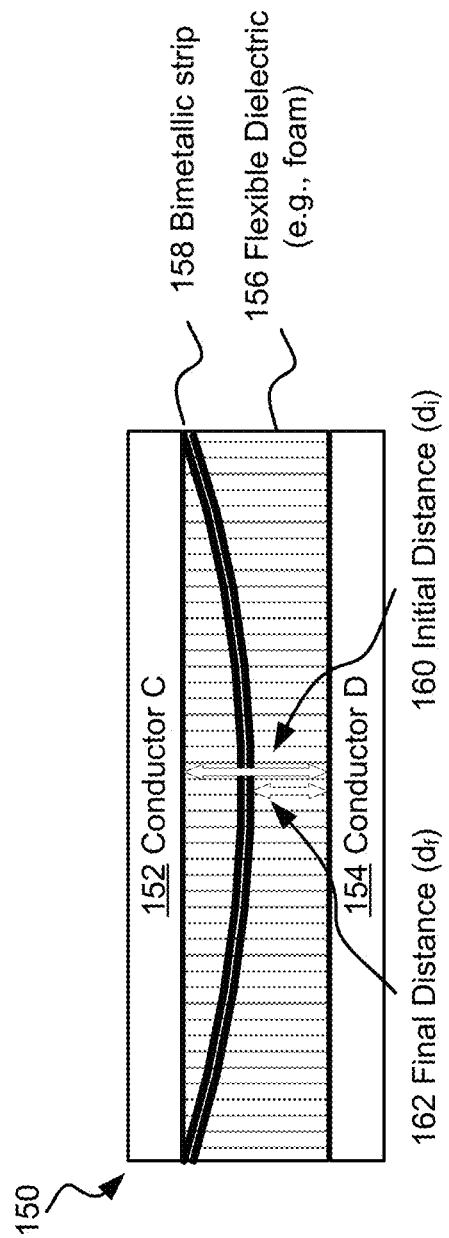
FIG. 1B depicts a diagram of an example capacitor including a flexible dielectric and a temperature sensitive bimetallic strip, in accordance with embodiments of the present disclosure.

FIG. 1B depicts a diagram of an example capacitor 150 including a flexible dielectric 156 and a temperature sensitive bimetallic strip 158, in accordance with embodiments of the present disclosure. Capacitor 150 is comprised of conductor C 152, conductor D 154, flexible dielectric 156, and bimetallic strip 158. Conductors C 152 and D 154 can serve as the parallel plates of capacitor 150 and can be substantially the same as Conductors A 102 and B 104 of FIG. 1A. However, bimetallic strip 158 can serve as one of the plates of capacitor 150 (i.e., one of conductors C 152 and D 154 can be optional) or bimetallic strip 158 can be electrically connected to one of conductors C 152 or D 154. Flexible dielectric 156 serves as the dielectric of capacitor 150 and can allow for movement in bimetallic strip 158. Flexible dielectric 156 can take the form of a foam material, including an Arlon® FoamClad$^{R/F}$™, including Arlon FoamClad 100 or Arlon FoamClad 400, which can compress in response to a moving bimetallic strip, in some embodiments. This material can be a laminate composite consisting of a low permittivity microporous polymeric core bonded to an impermeable copper-clad polymer film coverlay that provides a low composite dielectric constant. Any dielectric material which allows for movement in bimetallic strip 158 while retaining its dielectric properties can be used as flexible dielectric 156.

Bimetallic strip 158 can be composed of two different metals which respond differently to temperature. These metals can be chosen due to having different coefficient of thermal expansion characteristics. For example, one of the metals could be chosen to be copper and the other could be selected from steel, brass, or a copper-nickel alloy. When the temperature of bimetallic strip 158 is increased, one of the metals can expand at a greater rate than the other metal leading to curvature in the bimetallic strip 158. These metals can be chosen according to known metals used in the prior art relating to bimetallic strips. Initial distance ($d_i$) 160 is the distance between the bimetallic strip 158 and conductor D 154, where the initial position of bimetallic strip 158 is adjacent to conductor C 152 before bending. Final distance ($d_f$) 162 is the distance between the bimetallic strip 158 and conductor D 154, where the final position of bimetallic strip 158 is as shown after bending. The different capacitances of capacitor 150 with the bimetallic strip in an initial position (and having an initial distance ($d_i$) 160) and that of capacitor 150 in a final position (and having a final distance ($d_f$) 162) can be calculated using equation 1 with the corresponding distance value. If bimetallic strip 158 is positioned such that an increase in temperature leads to curvature towards the opposite plate (i.e. conductor D 154 as depicted in FIG. 1), when the temperature of capacitor 150 and its components is increased, the capacitance of capacitor 100 is increased. If bimetallic strip 158 is positioned such that an increase in temperature leads to curvature away from the opposite plate (i.e. conductor D 154), when the temperature of capacitor 100 and its components is increased, the capacitance of capacitor 150 is decreased. In some embodiments, both of the plates of capacitor 150 can be bimetallic strips or can be connected to bimetallic strips (not shown). For example, the bimetallic strips can be positioned such that both bimetallic strips curve towards each other as temperature increases, thereby doubling the change in distance and the resultant change in capacitance. Use of two bimetallic strips in this fashion can also allow for greater flexibility in the metals chosen as each strip will not need to curve as far to achieve a desired effect at the operating temperature of the capacitor 150.

Figure 2:
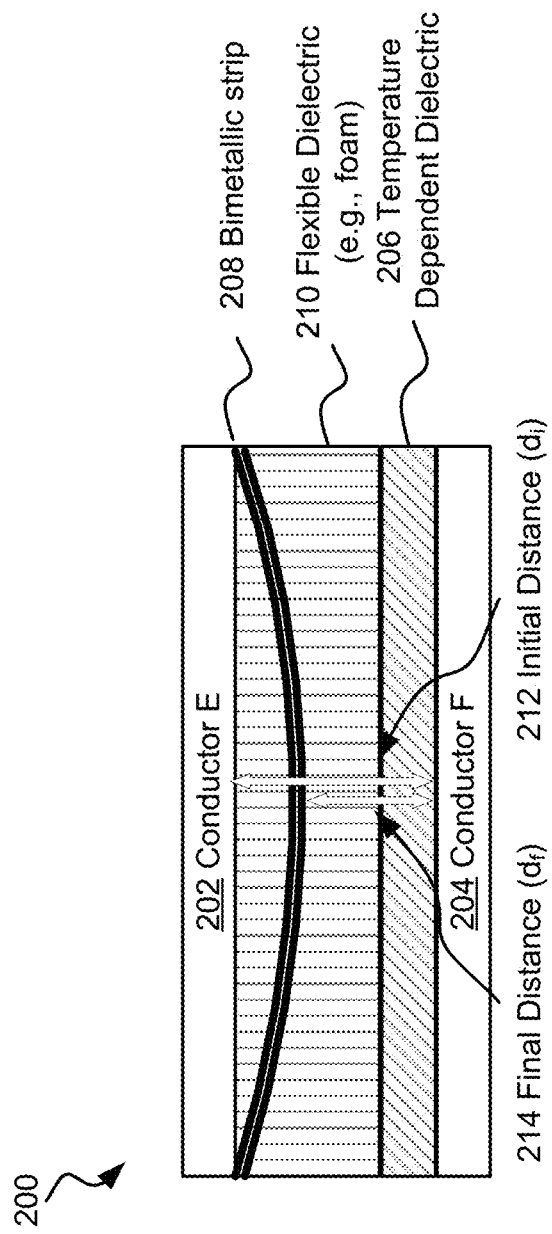
FIG. 2 depicts a diagram of an example capacitor including a temperature-dependent dielectric and a temperature sensitive bimetallic strip, in accordance with embodiments of the present disclosure.

FIG. 2 depicts a diagram of an example capacitor 200 including a temperature-dependent dielectric 206 and a temperature sensitive bimetallic strip 208, in accordance with embodiments of the present disclosure. Capacitor 200 is comprised of conductor E 202, conductor F 204, temperature-dependent dielectric 206, flexible dielectric 210, and bimetallic strip 208. Conductors E 202 and conductor F 204 can serve as the parallel plates of capacitor 200 and can be substantially the same as Conductors A-D (102, 104, 152, and 154) shown in FIGS. 1A and 1B. Bimetallic strip 208 can serve as one of the plates of capacitor 200 (i.e., one of conductors E 202 and F 204 can be optional) or bimetallic strip 208 can be electrically connected to one of conductors E 202 and F 204. The dielectric of capacitor 200 is comprised of temperature-dependent dielectric 206 and flexible dielectric 210. The dielectric of capacitor 200 is then a mixed dielectric, which means the capacitance of capacitor 200 can be expressed by equation 2: $C=\varepsilon_1\varepsilon_2 A/(\varepsilon_1 d_1+\varepsilon_2 d_2)$ where C is the capacitance, $\varepsilon_x$ is the dielectric constant of the dielectric x for each of the corresponding portions of the dielectric, A is the area of a plate, and dx is the distance between the edges of each dielectric x for each of the corresponding portions of the dielectric. Flexible dielectric 210 can allow for movement in bimetallic strip 208. Flexible dielectric 210 can take the form of a foam material in some embodiments and can be substantially the same as flexible dielectric 156 of FIG. 1B. In some embodiments, flexible dielectric 210 and temperature-dependent dielectric 206 can be the same material such that capacitor 200 contains one flexible, temperature-dependent dielectric.

Bimetallic strip 208 can be composed of two different metals which respond differently to temperature and can be substantially similar to bimetallic strip 158 of FIG. 1B. Initial distance ($d_i$) 212 is the distance between the bimetallic strip 208 and conductor F 204, where the initial position of bimetallic strip 208 is adjacent to conductor E 202 before bending. Final distance ($d_f$) 214 is the distance between the bimetallic strip 208 and conductor F 204, where the final position of bimetallic strip 208 is as shown after bending. If bimetallic strip 208 is positioned such that an increase in temperature leads to curvature towards the opposite plate (i.e., conductor F 204 as depicted in FIG. 2), when the temperature of capacitor 200 and its components is increased, the capacitance of capacitor 200 is increased. If bimetallic strip 208 is positioned such that an increase in temperature leads to curvature away from the opposite plate (i.e., conductor F 208), when the temperature of capacitor 200 and its components is increased, the capacitance of capacitor 200 is decreased. In some embodiments, both of the plates of capacitor 200 can be bimetallic strips or can be connected to bimetallic strips (not shown). For example, the bimetallic strips can be positioned such that both bimetallic strips curve towards each other as temperature increases, thereby doubling the change in distance and resultant change in capacitance. Use of two bimetallic strips in this fashion can also allow for greater flexibility in the metals chosen as each strip will not need to curve as far to achieve a desired effect at the operating temperature of the capacitor 200.

Figure 3:
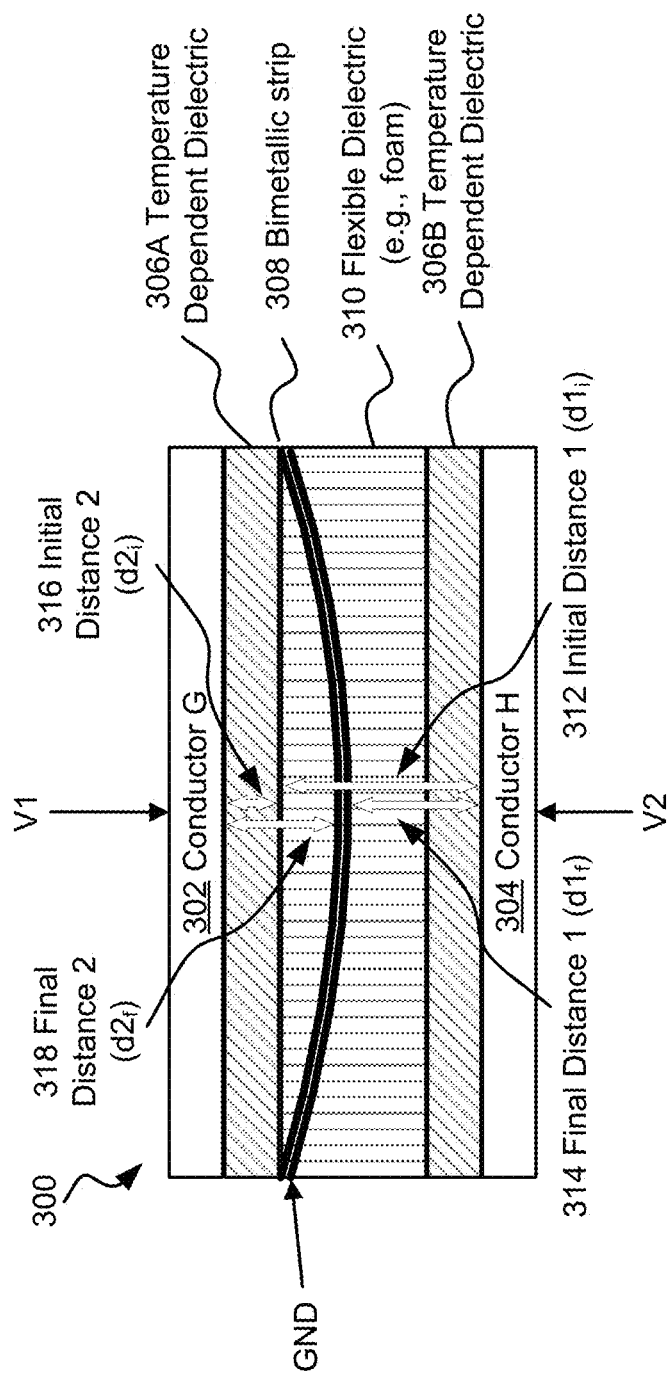
FIG. 3 depicts a diagram of an example capacitor including a temperature-dependent dielectric and a temperature sensitive bimetallic strip in operation, in accordance with embodiments of the present disclosure.

FIG. 3 depicts a diagram of an example capacitor 300 in operation including a temperature-dependent dielectric 306A and 306B and a temperature sensitive bimetallic strip 308, in accordance with embodiments of the present disclosure. Capacitor 300 is comprised of conductor G 302, conductor H 304, temperature-dependent dielectrics 306A and 306B, flexible dielectric 310, and bimetallic strip 308. Conductors G 302 and conductor H 304 can serve as two of the parallel plates of capacitor 300 and can be substantially the same as Conductors A-F (102, 104, 152, 154, 202, and 204) of FIGS. 1A, 1B and 2. Bimetallic strip 308 can be substantially the same as bimetallic strip 208 of FIG. 2 and can serve as a third plate of capacitor 300. The dielectric of capacitor 300 is comprised of temperature-dependent dielectrics 306A and 306B and flexible dielectric 310. In some embodiments, only one of temperature-dependent dielectrics 306A and 306B will be present. Flexible dielectric 310 can allow for movement in bimetallic strip 308. Flexible dielectric 310 can take the form of a foam material in some embodiments and can be substantially the same as flexible dielectric 156 of FIG. 1B. In some embodiments, flexible dielectric 310 and temperature-dependent dielectric 306A and 306B can be the same material such that capacitor 300 contains one flexible, temperature-dependent dielectric.

As depicted in FIG. 3, a voltage V1 is applied to conductor G 302, a voltage V2 is applied to conductor H 304, and bimetallic strip 308 is connected to ground (GND). As such, capacitor 300 includes two capacitance values (one between conductor G 302 and bimetallic strip 308 and a second between conductor H 304 and bimetallic strip 308). When the bimetallic strip 308 is subjected to a change in temperature, these two capacitance values change in opposite directions (one rises as the other falls). If bimetallic strip 308 is positioned such that an increase in temperature leads to curvature towards conductor H 304 (as depicted in FIG. 3), when the temperature of capacitor 300 and its components is increased, the capacitance between conductor H 304 and bimetallic strip 308 is increased, and the capacitance between conductor G 302 and bimetallic strip 308 is decreased. If bimetallic strip 308 is positioned such that an increase in temperature leads to curvature towards conductor G 302 (not depicted in FIG. 3), when the temperature of capacitor 300 and its components is increased, the capacitance between conductor G 302 and bimetallic strip 308 is increased, and the capacitance between conductor H 304 and bimetallic strip 308 is decreased. This can be used to give more capacitance to a more capacitance needy load, such as where one circuit requires additional capacitance at higher temperatures.

Initial distance 1 ($d1_i$) 312 is the distance between the bimetallic strip 308 and conductor H 304 where the initial position of bimetallic strip 308 is between temperature-dependent dielectric 306A and flexible dielectric 310 before bending. Final distance 1 ($d1_f$) 314 is the distance between the bimetallic strip 308 and conductor H 304, where the final position of bimetallic strip 308 is as shown after bending. Initial distance 2 ($d2_i$) 316 is the distance between the bimetallic strip 308 and conductor G 302. Final distance 2 ($d2_f$) 318 is the distance between the bimetallic strip 308 and conductor G 302. The initial and final capacitance values between conductor G 302 and bimetallic strip 308 or between conductor H 304 and bimetallic strip 308 can be calculated by including the respective distance values in the capacitance formulas.

In some embodiments, additional plates of capacitor 300 can be bimetallic strips (not shown). For example, one or both of conductor G 302 and conductor H 304 can be bimetallic strips and can be positioned such that two of the bimetallic strips curve towards each other as temperature increases, thereby doubling the change in distance and resultant change in capacitance. Use of multiple bimetallic strips in this fashion can also allow for greater flexibility in the metals chosen as each strip will not need to curve as far to achieve a desired effect at the operating temperature of the capacitor 300.

Figure 4:
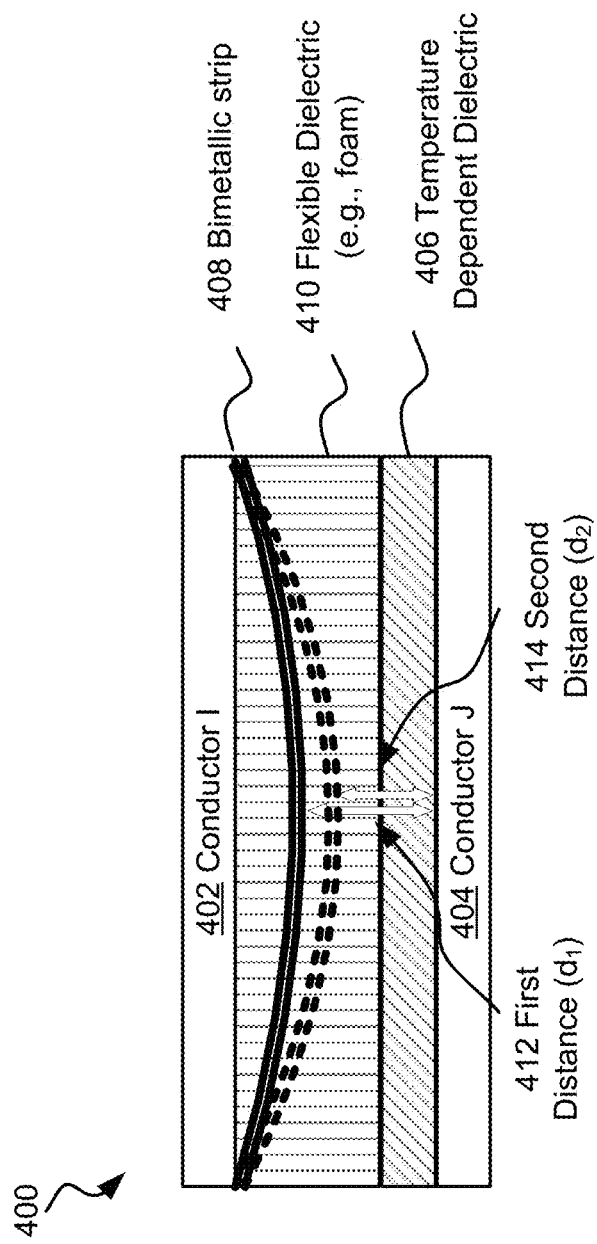
FIG. 4 depicts a diagram of an example capacitor including a temperature-dependent dielectric and a temperature sensitive bimetallic strip acting as a switch, in accordance with embodiments of the present disclosure.

FIG. 4 depicts a diagram of an example capacitor 400 including a temperature-dependent dielectric 406 and a temperature sensitive bimetallic strip 408 acting as a switch, in accordance with embodiments of the present disclosure. Capacitor 400 is comprised of conductor I 402, conductor J 404, temperature-dependent dielectric 406, flexible dielectric 410, and bimetallic strip 408. Conductors I 402 and conductor J 404 can serve as the parallel plates of capacitor 400 and can be substantially the same as the conductors described above with respect to the other figures of this disclosure. Bimetallic strip 408 can serve as one of the plates of capacitor 400 (i.e., one of conductors I 402 and J 404 can be optional), or bimetallic strip 408 can be electrically connected to one of conductors I 402 and J 404. The dielectric of capacitor 400 is comprised of temperature-dependent dielectric 406 and flexible dielectric 410. The dielectric of capacitor 400 is then a mixed dielectric, which means the capacitance of capacitor 400 can be expressed by equation 2. Flexible dielectric 410 can allow for movement in bimetallic strip 408. Flexible dielectric 410 can take the form of a foam material in some embodiments and can be substantially the same as flexible dielectric 156 of FIG. 1B. In some embodiments, flexible dielectric 410 and temperature-dependent dielectric 406 can be the same material such that capacitor 400 contains one flexible, temperature-dependent dielectric.

Bimetallic strip 408 can be composed of two different metals which respond differently to temperature and can be substantially similar to bimetallic strips 158, 208, and 308 of FIGS. 1B, 2, and 3. Bimetallic strip 408 is depicted in two positions in FIG. 4: one corresponding to a pair of solid lines, and the second corresponding to a pair of dashed lines. In the example of FIG. 4, capacitor 400 can act as a switch, such as a radio-frequency switch. Bimetallic strip 408 of capacitor 400 can be located sufficiently far from the opposite conductor (Conductor J 404 in an initial position and through a range of motion (such as reaching the solid line position)) such that the capacitance of capacitor 400 is a very low value. As the temperature changes sufficiently for bimetallic strip 408 to reach a second position (such as the dashed line position), the bimetallic strip 408 can move close enough to the conductor J 404 to capacitively couple. This can create a new "state" once a particular temperature is reached. As such, an on-off relationship can be created by the capacitor 400 based on the temperature and corresponding position of the bimetallic strip. In some embodiments, capacitor 400 can be used as a temperature sensor instead of, or in addition to, a switch. For example, temperature can be calculated based on the capacitance of capacitor 400 based on amount of deflection of bimetallic strip 408.

In some embodiments, bimetallic strip 408 can be present in a cantilever fashion, where instead of the middle of the bimetallic strip 408 bending to approach conductor J 404, one end of bimetallic strip 408 can be fixed and the other end bending to approach conductor J 404. In such a cantilever design, a first location may be where the bimetallic strip 408 is flat against conductor I 402 or partially bent towards conductor J 404 and the second location may be where the movable end of bimetallic strip 408 is sufficiently close to conductor J 404 to capacitively couple.

First distance ($d_1$) 412 is the distance between the bimetallic strip 408 and conductor J 404 where the bimetallic strip 408 is too far from conductor J 402 to capacitively couple. Second distance ($d_2$) 414 is the distance between the bimetallic strip 408 and conductor J 404 where the bimetallic strip 408 has come close enough to conductor J 402 to capacitively couple. In some embodiments, both of the plates of capacitor 400 can be bimetallic strips or can be connected to bimetallic strips (not shown). For example, the bimetallic strips can be positioned such that both bimetallic strips curve towards each other as temperature increases, thereby doubling the change in distance and lowering the distance each bimetallic strip needs to move in order to reach capacitive coupling. Use of two bimetallic strips in this fashion can also allow for greater flexibility in the metals chosen as each strip will not need to curve as far to achieve a desired effect at the operating temperature of the capacitor 400.

FIG. 5A depicts a cross-sectional view diagram 500 of an example printed circuit board (PCB) 508, integrated circuit (IC) package 506, and IC 502 where a temperature-dependent capacitor 510 is positioned within the PCB, in accordance with embodiments of the present disclosure. It is to be understood that the view diagram 500 of FIG. 5A is provided for the purpose of illustration only, and may not accurately represent dimensions, proportions, or other physical features of elements such as PCBs, IC packages, ICs, and solder balls. In some embodiments, the IC can be completely encapsulated by the IC package 506, and/or there may be e.g., a lid (not depicted) covering the IC 502.

View diagram 500 includes an IC 502 mounted on an IC package 506, which is attached to PCB 508. Solder balls 504 can be reflowed to attachment pads (not depicted) of IC package 506 and to attachment pads (not depicted) of PCB 508. In embodiments, IC 502 can be an IC such as a processor or GPU chip, IC package 506 can be a ceramic or organic multi-layer substrate, and PCB 508 can include, for example, a motherboard or daughter card. Solder balls 504 can be formed from a high-temperature solder that is reflowed using a lower-temperature solder paste to form a bond to attachment pads on IC package 506 and PCB 508.

Included within PCB 508 is capacitor 510. Capacitor 510 can take the form of one of the example capacitors shown in FIG. 1A, 1B, 2, 3, or 4, or variations thereof. As such, capacitor 510 can be a temperature-dependent capacitor which has a variable capacitance based on temperature due to one or more of a temperature-dependent dielectric or a bimetallic strip serving as one of the plates of capacitor 510. Capacitor 510 can be formed between two or more layers of PCB 508 in some embodiments. Capacitor 510 can be connected to IC 502 through two or more of solder balls 504 and through IC package 506. In some embodiments, capacitor 510 can be used to reduce or eliminate noise or transients between the components present.

FIG. 5B depicts a cross-sectional view diagram 550 of an example printed circuit board (PCB) 558, integrated circuit (IC) package 556, and IC 552, where a temperature-dependent capacitor 560 is positioned within the IC package, in accordance with embodiments of the present disclosure. It is to be understood that the view diagram 550 of FIG. 5B is provided for the purpose of illustration only, and may not accurately represent dimensions, proportions, or other physical features of elements such as PCBs, IC packages, ICs, and solder balls. In some embodiments, the IC can be completely encapsulated by the IC package 556, and/or there may be e.g., a lid (not depicted) covering the IC 552.

View diagram 550 includes an IC 552 mounted on an IC package 556, which is attached to PCB 558. Solder balls 554 can be reflowed to attachment pads (not depicted) of IC package 556 and to attachment pads (not depicted) of PCB 558. In embodiments, IC 552 can be an IC such as a processor or GPU chip, IC package 556 can be a ceramic or organic multi-layer substrate, and PCB 558 can include, for example, a motherboard or daughter card. Solder balls 554 can be formed from a high-temperature solder that is reflowed using a lower-temperature solder paste to form a bond to attachment pads on IC package 556 and PCB 558.

Included within IC Package 556 is capacitor 560. Capacitor 560 can take the form of one of the example capacitors shown in FIG. 1A, 1B, 2, 3, or 4, or variations thereof. As such, capacitor 560 can be a temperature-dependent capacitor which has a variable capacitance based on temperature due to one or more of a temperature-dependent dielectric or a bimetallic strip serving as one of the plates of capacitor 560. Capacitor 560 can be formed between two or more layers of IC Package 556 in some embodiments. Capacitor 560 can be connected to IC 552. In some embodiments, capacitor 560 can be used to reduce or eliminate noise or transients between the components present.

Figure 6:
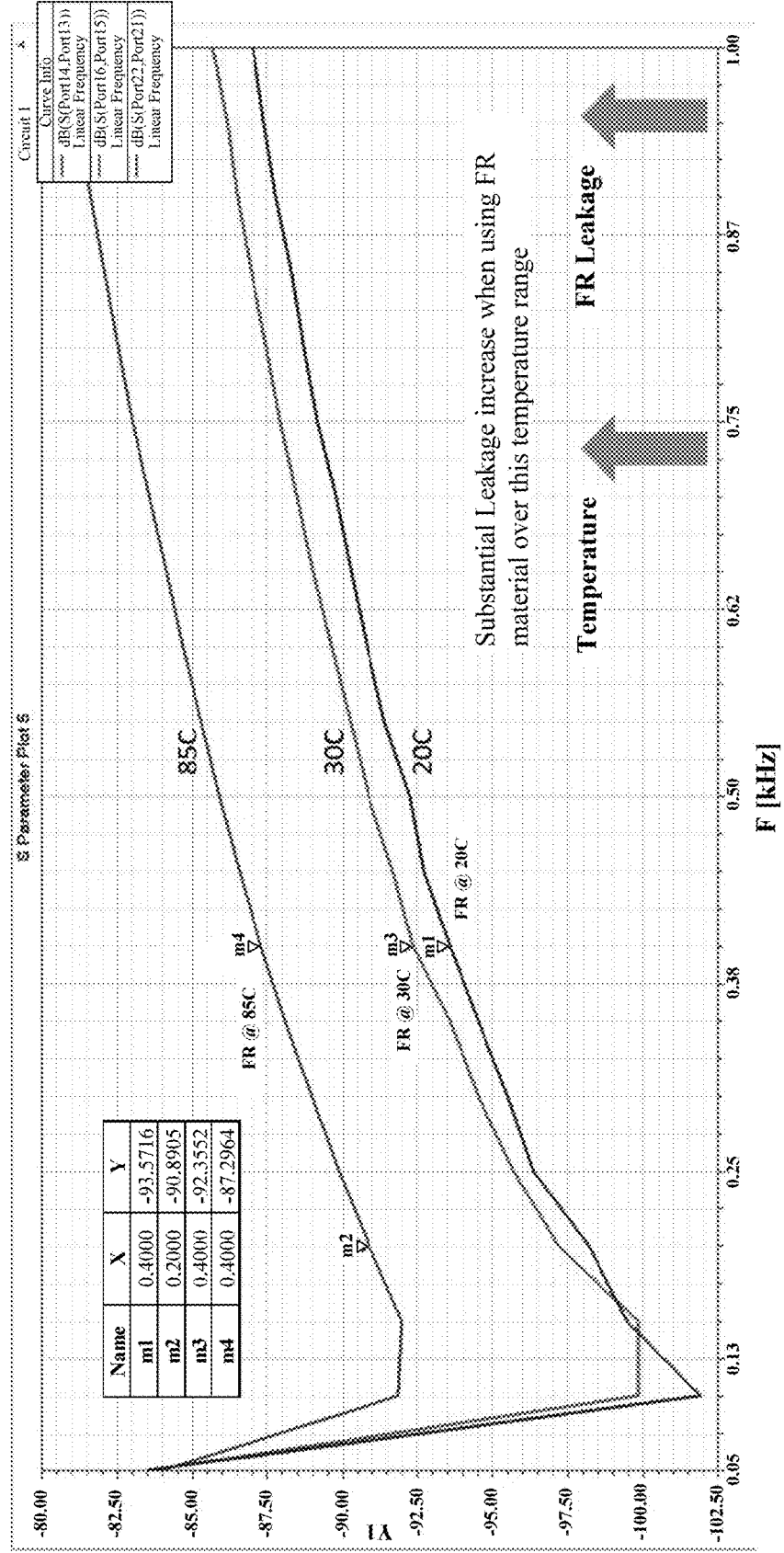
FIG. 6 depicts a graph of the leakage vs frequency of a temperature-dependent capacitor with a negative correlation between temperature and capacitance at three temperature values, in accordance with embodiments of the present disclosure.

FIG. 6 depicts a graph 600 of the leakage vs frequency of a temperature-dependent capacitor with a negative correlation between temperature and capacitance at three temperature values, in accordance with embodiments of the present disclosure. Dielectric materials do not provide perfect insulation and allow some current to leak through a capacitor. The amount of leakage can also be correlated to temperature in a similar fashion to capacitance discussed supra. Graph 600 depicts the frequency on the x axis and leakage on the y axis for an example temperature-dependent capacitor. Graph 600 can correspond to an example capacitor shown in FIG. 1A, 1B, 2, 3, or 4, or variations thereof. As such, graph 600 can correspond to a temperature-dependent capacitor which has a variable capacitance based on temperature due to one or more of a temperature-dependent dielectric or a bimetallic strip serving as one of the plates of the capacitor. Graph 600 includes three curves, the topmost curve corresponding to the example capacitor operating at 85° C., the middle curve corresponding to the example capacitor operating at 30° C., and the bottom curve corresponding to the example capacitor operating at 20° C. Specific values for the x and y coordinates of these curves are given for points m1, m2, m3, and m4 for example purposes only. As shown in FIG. 6, this example capacitor uses a "FR" material, which stands for flame retardant, and experiences a significant leakage increase as temperature increases between these three curves. This can occur when using a capacitor with a negative correlation between temperature and capacitance.

Figure 7:
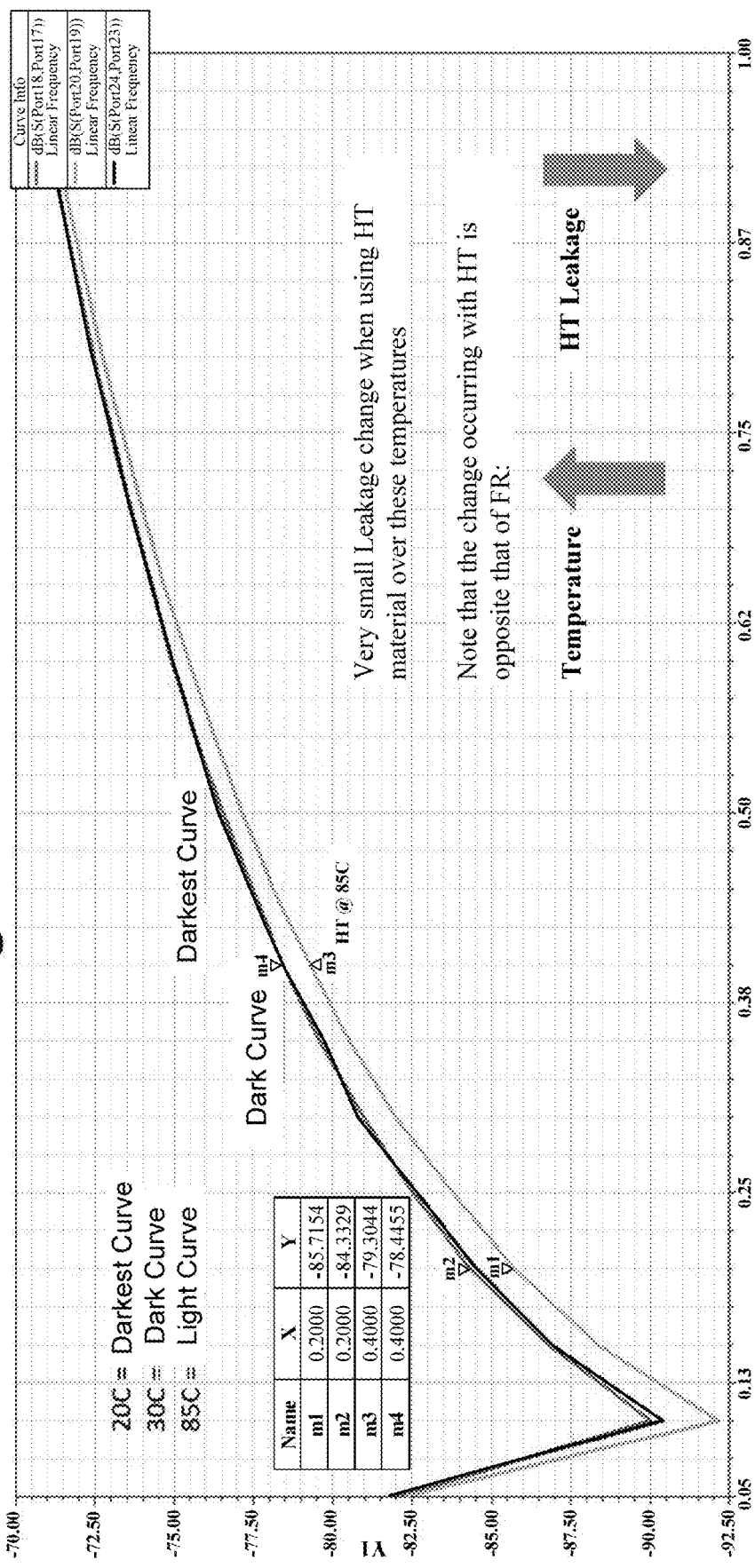
FIG. 7 depicts a graph of the leakage vs frequency of a temperature-dependent capacitor with a positive correlation between temperature and capacitance at three temperature values, in accordance with embodiments of the present disclosure.

FIG. 7 depicts a graph 700 of the leakage vs frequency of a temperature-dependent capacitor with a positive correlation between temperature and capacitance at three temperature values, in accordance with embodiments of the present disclosure. Graph 700 depicts the frequency on the x axis and leakage on the y axis for an example temperature-dependent capacitor. Graph 700 can correspond to an example capacitor shown in FIG. 1A, 1, 2, 3, or 4, or variations thereof. As such, graph 700 can correspond to a temperature-dependent capacitor which has a variable capacitance based on temperature due to one or more of a temperature-dependent dielectric or a bimetallic strip serving as one of the plates of the capacitor. Graph 700 includes three curves, the top two curves overlapping at times and corresponding to the example capacitor operating at 20° C. (darkest curve) and 30° C. (dark curve) and the bottom curve corresponding to the example capacitor operating at 85° C. Specific values for the x and y coordinates of these curves are given for points m1, m2, m3, and m4 for example purposes only. As shown in FIG. 7, this example capacitor uses an "HT" material, which stands for high temperature, and experiences less leakage as temperature increases between these three curves. This can occur when using a capacitor with a positive correlation between temperature and capacitance.

Figure 8:
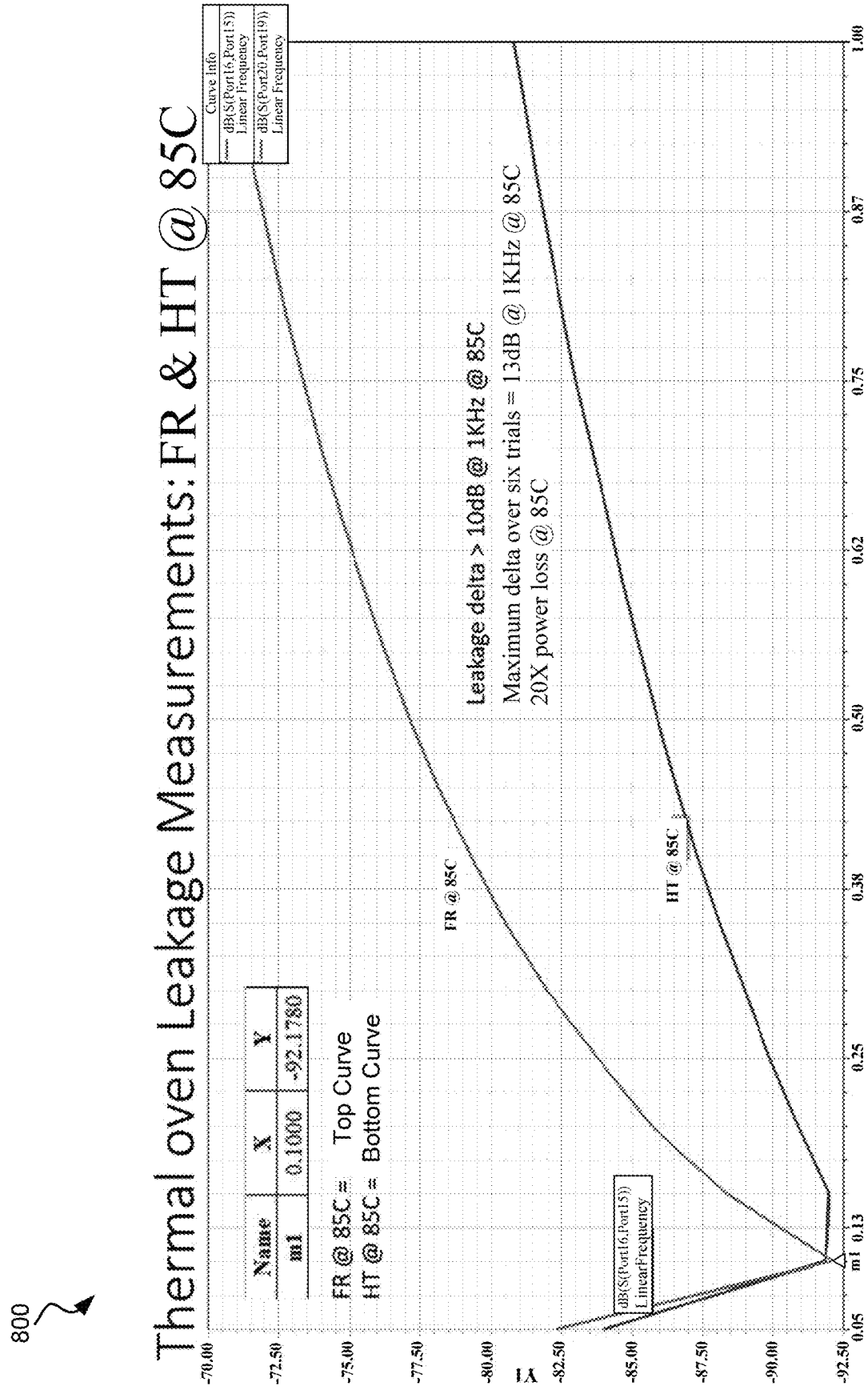
FIG. 8 depicts a comparison graph of the leakage vs frequency of temperature-dependent capacitors with positive and negative correlations between temperature and capacitance, in accordance with embodiments of the present disclosure.

FIG. 8 depicts a comparison graph 800 of the leakage vs frequency of temperature-dependent capacitors with positive and negative correlations between temperature and capacitance at 85° C., in accordance with embodiments of the present disclosure. Graph 800 depicts the frequency on the x axis and leakage on the y axis for two example temperature-dependent capacitors. Graph 800 can correspond to example capacitors shown in FIG. 1A, 1, 2, 3, or 4 using different temperature-dependent dielectrics or bimetallic strips, or variations thereof. Graph 800 can depict the same "FR" material shown in graph 600 of FIG. 6 as the top curve and the same "HT" material shown in graph 700 of FIG. 7 as the bottom curve. Graph 800 depicts quantifiable differences in practical uses for two different temperature-dependent capacitors. As shown on graph 800, the difference in leakage at 85° C. is greater than 10 dB at 1 KHz and the highest recorded difference between six exemplary trials was 13 dB which corresponds to a 20 times loss in power between these capacitors.

Figure 9:
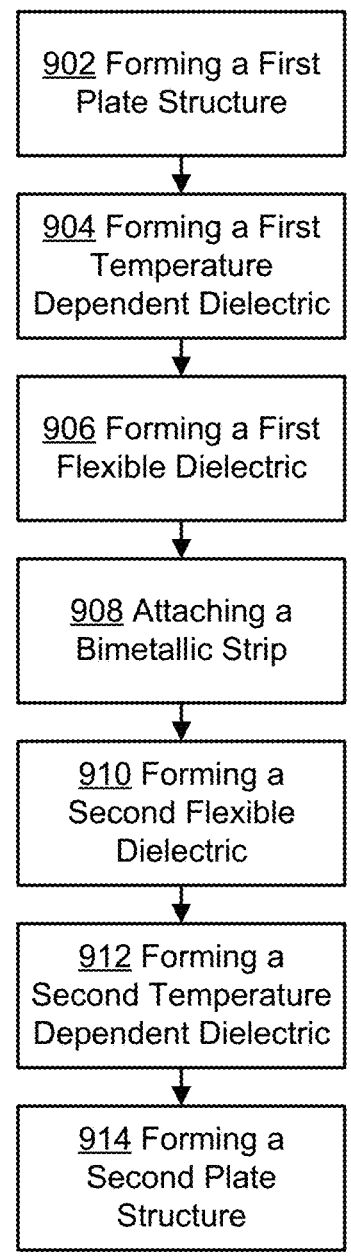
FIG. 9 depicts a flowchart of an example method for making a temperature-dependent capacitor, in accordance with embodiments of the present disclosure.

FIG. 9 depicts a flowchart of an example method 900 for making a temperature-dependent capacitor, in accordance with embodiments of the present disclosure. Method 900 can include more or fewer operations than those depicted. Where appropriate, method 900 can include operations in different orders than those depicted, such as to pre-fabricate two or more components before adding them to the temperature-dependent capacitor. While method 900 involves two plate structures, two temperature-dependent dielectrics, two flexible dielectrics, and one bimetallic strip, variations of this example method 900 can be used to form any of the capacitors described in this disclosure including by varying the number of each of the components as described herein and variations thereof.

Method 900 begins at 902 by forming a first plate structure. The forming of a first plate structure at 902 can be performed via a variety of techniques, including depositing a metal or alloy onto a substrate. The first plate structure can be of a metal or alloy which is conductive and is capable of serving as a plate in a capacitor.

At 904, a first temperature-dependent dielectric is formed. The first temperature-dependent dielectric can be formed by depositing the material for the temperature-dependent dielectric onto the first plate structure formed at 902. The first temperature-dependent dielectric can be composed of one or more materials such as glass, ceramic, plastic film, paper, mica, air, and oxide layers, where the material(s) have a dielectric constant (ε) which is dependent on temperature.

At 906, a first flexible dielectric is formed. The first flexible dielectric can be formed by depositing the material for the flexible dielectric onto the first temperature-dependent dielectric formed at 906. The flexible dielectric can be a foam material, such as an Arlon Foam Clad. The flexible dielectric can be chosen such that it allows for movement of a bimetallic strip into or through at least a portion of the flexible dielectric.

At 908, a bimetallic strip is attached. In some embodiments, the bimetallic strip can be prefabricated and attached to the first flexible dielectric formed at 906. The bimetallic strip can be composed of two different metals which respond differently to temperature. When the temperature of the bimetallic strip is increased, one of the metals can expand at a greater rate than the other metal due to a greater coefficient of thermal expansion of the first material, leading to curvature in the bimetallic strip. These metals can be chosen according to known metals used in the prior art relating to bimetallic strips. The two metals of the bimetallic strip can be affixed to one another such that during curvature they remain connected despite their different properties. In some embodiments, operation 908 can occur before operation 906, for example in embodiments where the bimetallic strip is attached to the temperature-dependent dielectric or the first plate structure.

At 910, a second flexible dielectric is formed. The second flexible dielectric can be formed in a similar fashion as the first flexible dielectric material and can be formed by depositing the material for the second flexible dielectric onto the attached bimetallic strip at 908. The second flexible dielectric can be a foam material, such as an Arlon Foam Clad. The second flexible dielectric can be chosen such that it allows for movement of a bimetallic strip into or through at least a portion of the second flexible dielectric.

At 912, a second temperature-dependent dielectric is formed. The second temperature-dependent dielectric can be formed in a similar fashion as the first temperature-dependent dielectric and can be formed by depositing the material for the second temperature-dependent dielectric onto the second flexible dielectric formed at 910. The second temperature-dependent dielectric can be composed of one or more materials such as glass, ceramic, plastic film, paper, mica, air, and oxide layers where the material(s) have a dielectric constant (ε) which is dependent on temperature.

At 914, a second plate structure is formed. The forming of a second plate structure at 914 can be performed in a similar fashion as the first plate structure and can be formed via a variety of techniques, including depositing a metal or alloy onto a substrate. The second plate structure can be of a metal or alloy which is conductive and is capable of serving as a plate in a capacitor. After operation 914, method 900 ends.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments can be practiced. These embodiments were described in sufficient detail to enable those skilled in the art to practice the embodiments, but other embodiments can be used and logical, mechanical, electrical, and other changes can be made without departing from the scope of the various embodiments. In the previous description, numerous specific details were set forth to provide a thorough understanding the various embodiments. However, the various embodiments can be practiced without these specific details. In other instances, well-known circuits, structures, and techniques have not been shown in detail in order not to obscure embodiments.

What is claimed is:

1. A temperature-dependent capacitor comprising:
   a first conductive plate;
   a second conductive plate located in a parallel-planar orientation to the first conductive plate; and
   a dielectric separating the first conductive plate from the second conductive plate, wherein:
      the dielectric is sufficiently flexible to allow movement of the first conductive plate relative to the second conductive plate in response to an increase in temperature of the first conductive plate, wherein the dielectric includes a combination of two or more distinct dielectric materials comprising:
         a first dielectric material arranged adjacent to the second conductive plate, wherein there is—a positive correlation between temperature of the first dielectric-material—and dielectric constant (ε) value of the first dielectric material; and
         a second dielectric material arranged adjacent to the first conductive plate; and
      the first conductive plate is adapted such that a distance between at least a portion of the first conductive plate and at least a portion of the second conductive plate decreases as a temperature of the first conductive plate increases.

2. The temperature-dependent capacitor of claim 1, wherein the first conductive plate is comprised of a bimetallic strip.

3. The temperature-dependent capacitor of claim 2, wherein the dielectric material includes a foam material configured to allow for movement of the bimetallic strip.

4. The temperature-dependent capacitor of claim 2, wherein the bimetallic strip operates as a cantilever having a connected end and an unsupported end.

5. The temperature-dependent capacitor of claim 2, wherein the bimetallic strip is fixed at both ends such that a middle portion of the bimetallic strip bends towards the second conductive plate when the temperature of the first conductive plate increases.

6. The temperature-dependent capacitor of claim 1, wherein the dielectric material includes a foam material.

7. The temperature-dependent capacitor of claim 1, wherein the temperature-dependent capacitor is configured to operate as a temperature-dependent switch.

8. The temperature-dependent capacitor of claim 1, wherein the temperature-dependent capacitor is configured to operate as a temperature sensor.

9. The temperature-dependent capacitor of claim 1, wherein the at least two distinct dielectrics are arranged in separate layers between the first conductive plate and the second conductive plate.

10. The temperature-dependent capacitor of claim 1, wherein the first conductive plate is adapted to bend towards the second conductive plate when the temperature of the first conductive plate increases.

11. The temperature-dependent capacitor of claim 1, further comprising:
a third conductive plate located in a parallel-planar orientation to the first and second conductive plates, the third conductive plate being arranged opposite the second conductive plate such that the first conductive plate is between the second conductive plate and the third conductive plate; and
a third dielectric material between the third conductive plate and the first conductive plate.

12. The temperature-dependent capacitor of claim 11, wherein the third conductive plate is arranged such that a second distance between the third conductive plate and the portion of the first conductive plate increases as the temperature of the first conductive plate increases.

13. The temperature-dependent capacitor of claim 11, wherein a first capacitance between the first conductive plate and the second conductive plate increases as an operating temperature of the temperature-dependent capacitor increases, and wherein a second capacitance between the first conductive plate and the third conductive plate decreases as the operating temperature of the temperature-dependent capacitor increases.

14. The temperature-dependent capacitor of claim 1, wherein at least one of the first dielectric material and the second dielectric material is a flexible dielectric.

15. An electronic system comprising:
a printed circuit board (PCB);
a component electrically and mechanically attached to the PCB;
a temperature-dependent decoupling capacitor affixed to the PCB, the temperature-dependent decoupling capacitor electrically coupled to the component, the temperature-dependent decoupling capacitor comprising:
a first conductive plate;
a second conductive plate located in a parallel-planar orientation to the first conductive plate; and
a dielectric material including at least two distinctive dielectrics located between the first conductive plate and the second conductive plate, wherein:
the dielectric is sufficiently flexible to allow movement of the first conductive plate relative to the second conductive plate in response to an increase in temperature of the first conductive plate, wherein the dielectric includes a combination of two or more distinct dielectric materials comprising:
a first dielectric material arranged adjacent to the second conductive plate, wherein there is a positive correlation between temperature of the dielectric material and dielectric constant ($\varepsilon$) value of the dielectric material; and
a second dielectric material arranged adjacent to the first conductive plate; and
the first conductive plate is adapted such that a distance between at least a portion of the first conductive plate and at least a portion of the second conductive plate decreases as a temperature of the first conductive plate increases.

16. The electronic system of claim 15, wherein the temperature-dependent decoupling capacitor is affixed internally to the PCB.

17. The electronic system of claim 15, wherein the temperature-dependent decoupling capacitor is affixed externally to the PCB in a first level package.

18. The electronic system of claim 15, wherein the component is an integrated circuit (IC).

19. The electronic system of claim 15, further comprising a bimetallic strip located between the first conductive plate and the second conductive plate.

20. A temperature-dependent capacitor comprising:
a first conductive plate;
a second conductive plate located in a parallel-planar orientation to the first conductive plate,
wherein the first conductive plate is adapted such that a distance between at least a portion of the first conductive plate and at least a portion of the second conductive plate decreases as a temperature of the first conductive plate increases; and
a dielectric separating the first conductive plate from the second conductive plate, the dielectric including a combination of two or more distinct dielectric materials arranged in layers between the first and second conductive plates, the two or more distinct dielectric materials including:
a first dielectric material arranged adjacent to the second conductive plate, wherein there is a positive correlation between temperature of the first dielectric material and dielectric constant ($\varepsilon$) value of the first dielectric material; and
a second dielectric material arranged adjacent to the first conductive plate, the first dielectric material being sufficiently flexible to allow movement of the first conductive plate relative to the second conductive plate in response to the increase in the temperature of the first conductive plate.

* * * * *